(12) United States Patent
Zhao

(10) Patent No.: US 7,584,370 B2
(45) Date of Patent: Sep. 1, 2009

(54) CIRCUITS, SWITCH ASSEMBLIES, AND METHODS FOR POWER MANAGEMENT IN AN INTERFACE THAT MAINTAINS RESPECTIVE VOLTAGE DIFFERENCES BETWEEN TERMINALS OF SEMICONDUCTOR DEVICES IN OPEN AND CLOSE SWITCH STATES AND OVER A RANGE OF VOLTAGES

(75) Inventor: Bin Zhao, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 630 days.

(21) Appl. No.: 11/473,351

(22) Filed: Jun. 22, 2006

(65) Prior Publication Data

US 2008/0018358 A1  Jan. 24, 2008

(51) Int. Cl.
*G06F 1/26* (2006.01)
*H03K 17/00* (2006.01)
(52) U.S. Cl. .................... 713/300; 326/35; 327/365
(58) Field of Classification Search ................. 713/300; 326/35; 327/365
See application file for complete search history.

(56) References Cited

U.S. PATENT DOCUMENTS

| 6,154,014 | A  | * | 11/2000 | Suu ............................ 323/222 |
| 6,605,956 | B2 |   | 8/2003  | Farnworth et al. |
| 6,987,414 | B2 |   | 1/2006  | Numata |
| 2004/0177282 | A1 | * | 9/2004 | Twu ............................ 713/300 |
| 2006/0255852 | A1 | * | 11/2006 | O'Donnell et al. .......... 327/437 |

* cited by examiner

*Primary Examiner*—Chun Cao

(57) ABSTRACT

A semiconductor network is interposed between first and second multiple-port interfaces each having high-voltage, intermediate-voltage and ground ports to form a switch assembly. The assembly includes a primary switch circuit, a support network, internal and external-port circuits and internal and external-port control circuits. The primary switch circuit is coupled to high-voltage ports of the multiple-port interfaces and to the support network. The internal and external-port circuits are coupled to intermediate-voltage ports of the multiple-port interfaces, the internal and external-port control circuits and the support network. The internal-port control circuit is coupled to the internal-port circuit, the support network and a ground port of a first multiple-port interface. The external-port control circuit is coupled to the external-port circuit, the support network and a ground port of the second multiple-port interface. The assembly has a low-leakage current in both open and closed states when exposed to a range of high voltages.

24 Claims, 11 Drawing Sheets

CIRCUITS, SWITCH ASSEMBLIES, AND METHODS FOR POWER MANAGEMENT IN AN INTERFACE THAT MAINTAINS RESPECTIVE VOLTAGE DIFFERENCES BETWEEN TERMINALS OF SEMICONDUCTOR DEVICES IN OPEN AND CLOSE SWITCH STATES AND OVER A RANGE OF VOLTAGES

BACKGROUND OF THE INVENTION

This invention relates generally to a switch circuit that enables reliable long-term operation over a wide range of input voltages. More particularly, the invention relates to a switch architecture that enables reliable, long-term, on/off switch operation over a range of voltages.

The use of small geometry and low-voltage devices (i.e., devices that reliably operate when the voltage across any two transistor terminals is less than a relatively low maximum voltage) is the trend in advanced integrated circuits (ICs). These low-voltage digital-logic devices consume less power and can be reliably operated at higher clock rates. Accordingly, low-voltage devices are used in a number of battery-operated portable electronic systems. Intermediate voltage-level devices (i.e., devices that reliably operate when the voltage across any two transistor terminals is less than approximately 3V) are generally used in ICs that require analog functions. Even higher voltage levels are required by some circuits used in both analog and digital functional blocks related to system interfaces and other functions. One way to accommodate these higher voltages is to use transistors designed to reliably operate at corresponding voltage levels. For example, transistors where the voltage across any two transistor device terminals can be 5V without reliability issues (i.e., 5V transistors) can be used to manage inter-IC power (e.g., on/off) functions over a range of voltages from 0V to about 5V. This solution requires a second IC or the addition of devices designed to manage these higher voltages when the bulk of IC functionality is provided via a first IC that uses lower-voltage devices. Accordingly, ICs using higher-voltage transistors in addition to low-voltage devices result in increased cost and complexity for the final product.

Typically, IC manufacturers do not provide a product that combines low-voltage digital transistors, 3V analog input/output transistors and 5V analog/power transistors using a single manufacturing process. Accordingly, there would be a significant cost associated with using and developing a semiconductor wafer manufacturing process that could provide the desired combination of transistors on a single IC.

Other known solutions for power management have a limited operational voltage range. These solutions suffer from poor reliability when devices are required to handle voltage levels that are higher than the upper limit of their operational voltage and from bias-circuit leakage and low input impedance when voltage levels are lower than the lower limit of their operational voltage range. Although a limited operational voltage range is not a concern for some applications, some other applications require better switch properties, such as lower current leakage and higher input impedance at low voltage levels and increased reliability at high voltage levels. For example, the universal serial bus on-the-go (USB-OTG) extension of the USB 2.0 specification includes a session-request protocol (SRP) that requires extremely good switch "off" properties for power bus voltages from 0V to 2V and requires the power bus voltage to go as high as 5.25V.

Therefore, it would be desirable to provide a low cost, reliable and integrated power management solution that can be implemented using existing semiconductor manufacturing process technologies.

SUMMARY

Embodiments of a switch circuit or switch assembly comprise a first multiple port interface, a second multiple-port interface and a network of semiconductor circuits responsive to a control input inserted between high-voltage, intermediate-voltage and ground ports of the multiple-port interfaces. The network of semiconductor circuits is arranged such that over a select range of high-voltage levels applied to the respective high-voltage ports of the first and second multiple-port interfaces, a respective voltage difference between terminals of devices in the network of semiconductor circuits does not exceed a reliability threshold associated with the integrated circuit manufacturing process used to implement the network.

Additional embodiments of a switch circuit or a switch assembly comprise a first multiple-port interface, a second multiple-port interface, a primary switch circuit, a support network, internal and external-port circuits and internal and external-port control circuits. The first and second multiple-port interfaces each have high-voltage, intermediate-voltage and ground ports. The primary switch circuit is coupled to the respective high-voltage ports of the first and second multiple-port interfaces and the support network. The high-voltage port is further coupled to the support network. The internal-port circuit is coupled to the intermediate-voltage port of the first multiple-port interface, the internal-port control circuit and the support network. The external-port circuit is coupled to the intermediate-voltage port of the second multiple-port interface, an external-port control circuit and the support network. The internal-port control circuit is coupled to the internal-port circuit, the support network and the ground port of the first multiple-port interface. The external-port control circuit is coupled to the external-port circuit, the support network as well as the intermediate-voltage and ground ports of the second multiple-port interface.

In an alternative embodiment, the internal-port control circuit of the switch circuit or switch assembly is further coupled to the intermediate-voltage port of the first multiple-port interface.

One embodiment of a method for power management comprises providing a first multiple-port interface coupled to an internal circuit, providing a second multiple-port interface coupled to an external circuit, coupling a network of semiconductor circuits between the first multiple-port interface and the second multiple-port interface and applying a control signal to the network of semiconductor circuits to direct a primary switch circuit located within the network to one of a first state and a second state to open and close a conductive path from the first multiple-port interface to the second multiple-port interface while maintaining a respective voltage difference between terminals of devices in the network of semiconductor circuits such that each respective voltage difference does not exceed a reliability threshold.

The figures and detailed description that follow are not exhaustive. The disclosed embodiments are illustrated and described to enable one of ordinary skill to make and use the switch assembly. Other embodiments, features and advantages of the switch assembly and method for power management will be or will become apparent to those skilled in the art upon examination of the following figures and detailed description. All such additional embodiments, features and advantages are within the scope of the circuits and methods for power management as defined in the accompanying claims.

BRIEF DESCRIPTION OF THE FIGURES

The switch assembly and method for managing power between circuits can be better understood with reference to the following figures. The components within the figures are not necessarily to scale, emphasis instead being placed upon clearly illustrating the principles of the circuit and method. Moreover, in the figures, like reference numerals designate corresponding parts throughout the different views.

DETAILED DESCRIPTION

Figure 1:
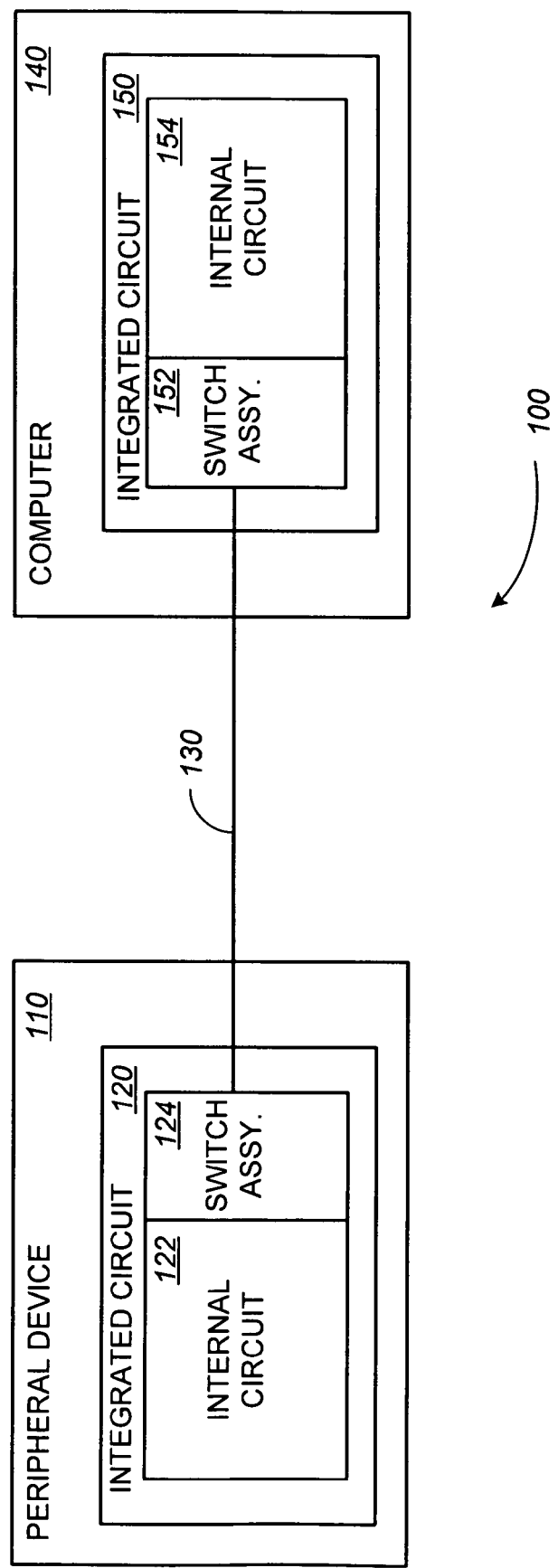
FIG. 1 is a block diagram of an embodiment of a pair of communicatively coupled systems.

Although described with particular reference to operation within the USB-OTG extension to the USB 2.0 specification, the switch circuit or switch assembly can be implemented in a myriad of systems and applications where it is desirable to provide switched power supplies while maintaining a respective voltage difference between terminals of devices in the switch circuit or switch assembly such that each respective voltage difference does not exceed a reliability threshold. For example, the switch assembly may be used in battery power management including battery charging applications.

The switch assembly can include any or a combination of the following technologies, which are all well known in the art: discrete electronic components, an integrated circuit, an application-specific integrated circuit having appropriately configured semiconductor devices and resistive elements, etc. The switch assembly provides reliable open/closed operation over a range of voltages and has minimal leakage current when the switch is open in the presence of these voltages.

In some embodiments, the switch assembly can be implemented with a combination of standard metal-oxide semiconductor transistors and laterally diffused metal-oxide semiconductor transistors. The low "closed state" resistance or "on" resistance of the switch assembly is accomplished by using standard metal-oxide semiconductor transistors in the power bus or high-voltage path of the switch assembly. The relatively high "on" resistance of the laterally diffused metal-oxide semiconductor transistors provides both high impedance and low current drain. Laterally diffused metal-oxide semiconductor transistors can be implemented using existing manufacturing technologies. By laterally shifting or extending the drain area, relatively higher voltage operation of the drain terminal can be reliably achieved while maintaining a lower voltage across other terminals of the semiconductor devices. The switch assembly is arranged such that transistors in one of the two operational modes maintain safe voltage differences between transistor terminals throughout the switch assembly. The switch assembly has a low leakage current in both states when exposed to a range of power bus voltages. Accordingly, the switch assembly provides an economical and reliable solution with good characteristics in both "closed" and "open" states from 0V to about 6V without the need for 5V transistors.

When the switch assembly is implemented within an integrated circuit, the integrated circuit can be manufactured using a single-well manufacturing process (e.g., n-well). Accordingly, the switch assembly provides a highly integrated, low-cost solution for switching voltage levels from 0V to a power bus voltage that exceeds a reliability threshold that defines a safe maximum voltage difference between the respective terminals of semiconductor devices used in the assembly.

The switch assembly is controlled via a control input which directs the switch assembly to one of an "open" and a "closed" state. When the switch assembly is implemented entirely within an integrated circuit, the control input can be generated on the same integrated circuit as the switch assembly or generated externally to the integrated circuit. When the switch assembly is directed to the "open" state, a conductive path between the respective high-voltage or power bus ports of the first and second multiple-port interfaces does not exist. When the switch assembly is directed to the "closed" state, a conductive path exists between the respective high-voltage ports of the first and second multiple-port interfaces.

When the switch assembly is implemented partially in software, the software portion can be used to generate a control input that directs a network of semiconductor circuits to open or close the switch assembly. The software can be stored in a memory and executed by a suitable instruction execution system (e.g., a microprocessor). The software for operating the switch assembly may comprise an ordered listing of executable instructions for implementing logical functions, and can be embodied in any "computer-readable medium" for use by or in connection with an instruction execution system, apparatus, or system, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with an instruction execution system.

In one embodiment, the control input for the switch assembly may be configured to direct the switch assembly to one of an "open" state or a "closed" state when a voltage level is below a threshold value and direct the switch assembly to the other state when a voltage level exceeds the threshold value. In other embodiments, the control input for the switch assembly may be configured with a first threshold, a buffer range of voltages, and a second threshold. In these other embodiments, a voltage level below the first threshold directs the switch assembly to one of an "open" state or a "closed" state. Whereas, a voltage level above the second threshold directs the switch assembly to the other state. The switch assembly ignores any voltage level between the first and second thresholds.

Turning now to the drawings, wherein like reference numerals designate corresponding parts throughout the drawings, reference is made to FIG. 1, which illustrates system 100. System 100 includes a peripheral device 110 connected to a computer 140 via a connection 130. Both peripheral device 110 and computer 140 contain respective integrated circuits. Integrated circuit 120 associated with peripheral device 110 is coupled to integrated circuit 150 associated with computer 140 via switch assembly 124, connection 130, and switch assembly 152. Switch assembly 124 and switch assembly 152 are implemented within respective integrated circuits (IC 120 and IC 150), which further include internal circuit 122 and internal circuit 154. From the perspective of peripheral device 110 and integrated circuit 120, internal circuit 154 and switch assembly 152 are external circuits. From the perspective of computer 140 and integrated circuit 150, internal circuit 122 and switch assembly 124 are external circuits.

In alternative embodiments, one or both of switch assembly 124 and switch assembly 152 or portions thereof may be implemented with discrete devices external to an IC. For example, a switch assembly may be used to controllably couple a power source to a load such as, but not limited to, a battery.

In the illustrated embodiment, system 100 includes dissimilar devices (i.e., peripheral device 110 and computer 140). System 100 is not limited to this combination and may include similarly configured devices or other power sources such as a battery.

Although connection 130 is illustrated in FIG. 1 as a single link connecting peripheral device 110 to computer 140, and more particularly switch assembly 124 with switch assembly 152, it will be appreciated that connection 130 can be a multiple conductor connection such as those configured to support operation of a data transfer mechanism such as the universal serial bus 2.0. Switch assembly 124 and switch assembly 152, as described in further detail below, are well suited to support the USB-OTG extension to the universal serial bus 2.0 specification.

Figure 2:
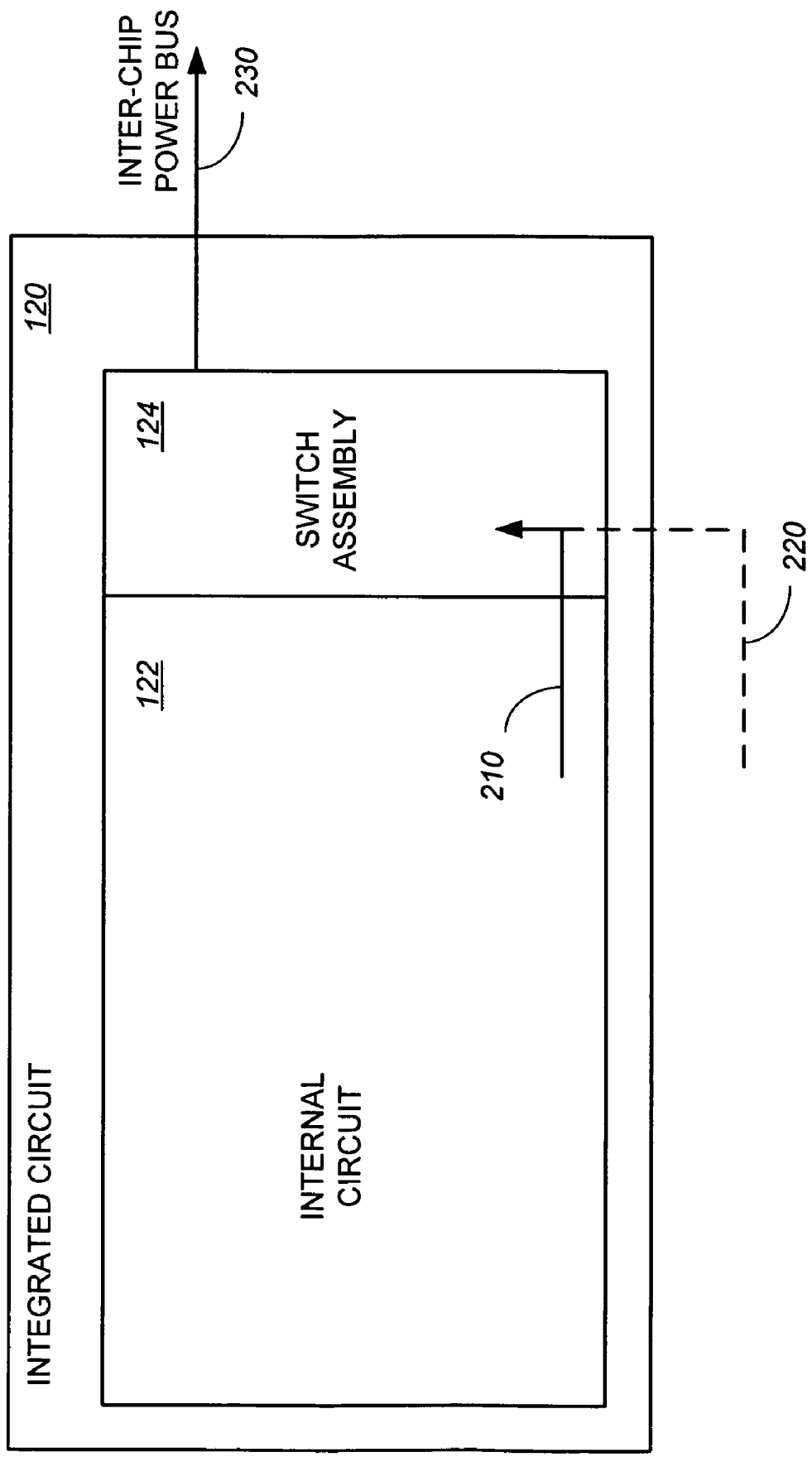
FIG. 2 is a block diagram illustrating an embodiment of an integrated circuit of FIG. 1.

FIG. 2 is a block diagram illustrating an embodiment of integrated circuit 120 of FIG. 1. Integrated circuit 120 comprises internal circuit 122 with switch assembly 124 coupling internal circuit 122 to off-chip or external circuits and devices via inter-chip power bus 230 included in connection 130 (FIG. 1). Control input 210 directs switch assembly 124 to one of an open state or a closed state. When switch assembly 124 is directed to the open state, internal circuit 122 is decoupled from the inter-chip power bus 230. When switch assembly 124 is directed the closed state, internal circuit 122 is coupled to the inter-chip power bus 230. Control input 210 can be generated within internal circuit 122 (i.e., on the same integrated circuit as switch assembly 124). Alternatively, control input 220 can be generated externally to integrated circuit 120. Control input 220 directs switch assembly 124 in the same manner as control input 210.

Figure 3A:
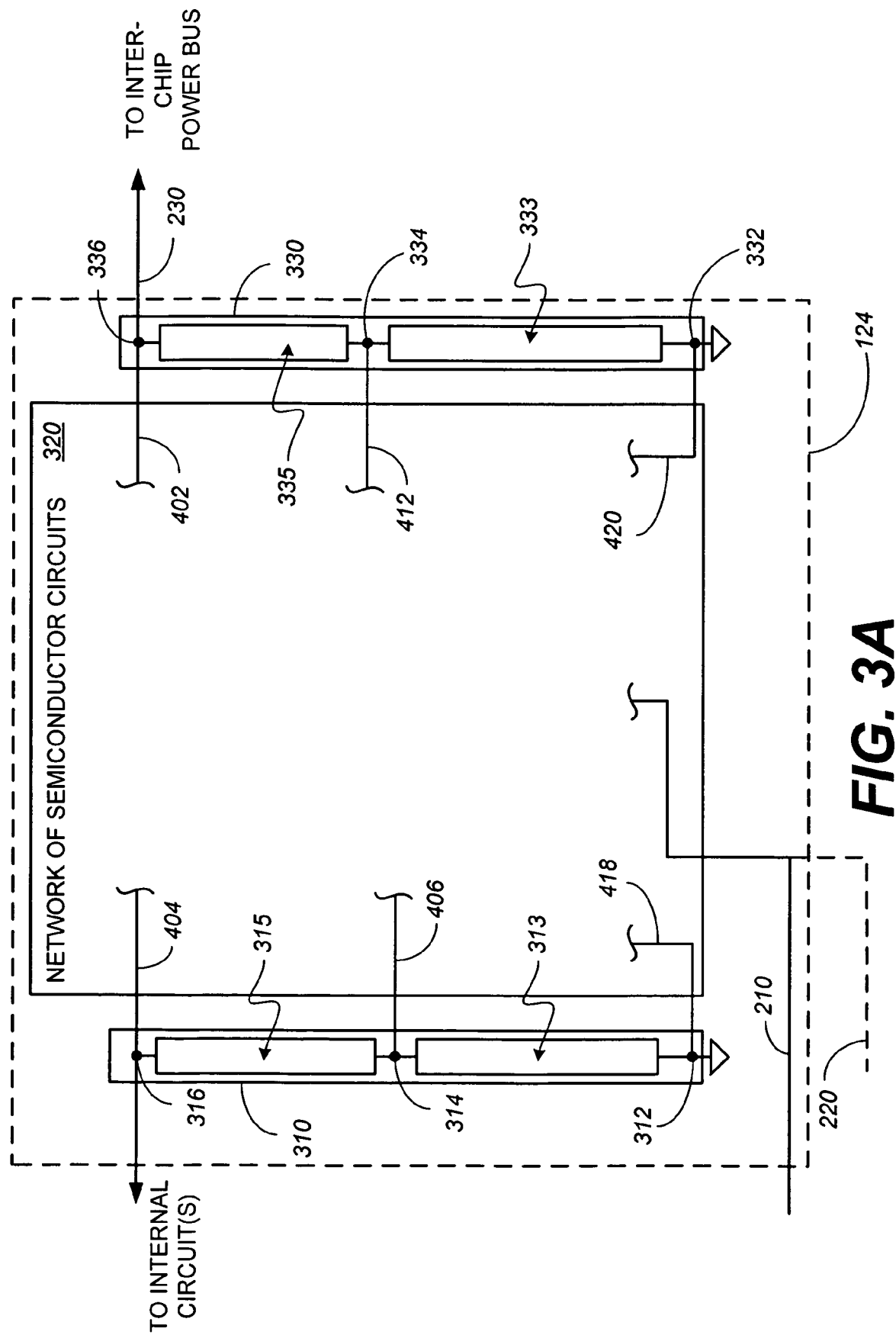
FIG. 3A is a schematic diagram illustrating an embodiment of the switch assembly of FIG. 2.

FIG. 3A is a schematic diagram illustrating an embodiment of switch assembly 124 of FIG. 2. Switch assembly 124 is interposed between internal circuits 122 (FIG. 2) and the inter-chip power bus 230. Switch assembly 124 is responsive to control input 210 or control input 220. As described above, control input 210 is generated on the same integrated circuit as switch assembly 124, whereas control input 220 is generated externally to integrated circuit 120 (FIG. 2). A first multiple-port interface 310 couples a network of semiconductor circuits 320 to internal circuits 122. A second multiple-port interface 330 couples the network of semiconductor circuits 320 to the inter-chip power bus 230.

First multiple-port interface 310 includes resistive element 313 and resistive element 315 arranged in series between connection 404, which is connected to the internal circuit, and ground. The arrangement of resistive element 313 and resistive element 315 between the internal circuits and ground produces ground port 312, intermediate-voltage port 314 and high-voltage port 316. Second multiple-port interface 330 includes resistive element 333 and resistive element 335 arranged in series between connection 402, which is connected to the inter-chip power bus 230, and ground. The arrangement of resistive element 333 and resistive element 335 between the inter-chip power bus 230 and ground produces ground port 332, intermediate-voltage port 334 and high-voltage port 336. Resistive element 313, resistive element 315, along with resistive element 333 and resistive element 335 may comprise any combination of resistors and or transistors as may be desired.

As further illustrated in FIG. 3A, network of semiconductor circuits 320 is coupled to the various ports of the first multiple-port interface 310, with connection 404 providing the voltage present on high-voltage port 316, connection 406 providing the voltage present on intermediate-voltage port 314 and connection 418 providing a ground. Network of semiconductor circuits 320 is further coupled to the various ports of the second multiple-port interface 330, with connection 402 providing the voltage present on high-voltage port 336, connection 412 providing the voltage present on intermediate-voltage port 334 and connection 420 providing a ground.

Figure 3B:
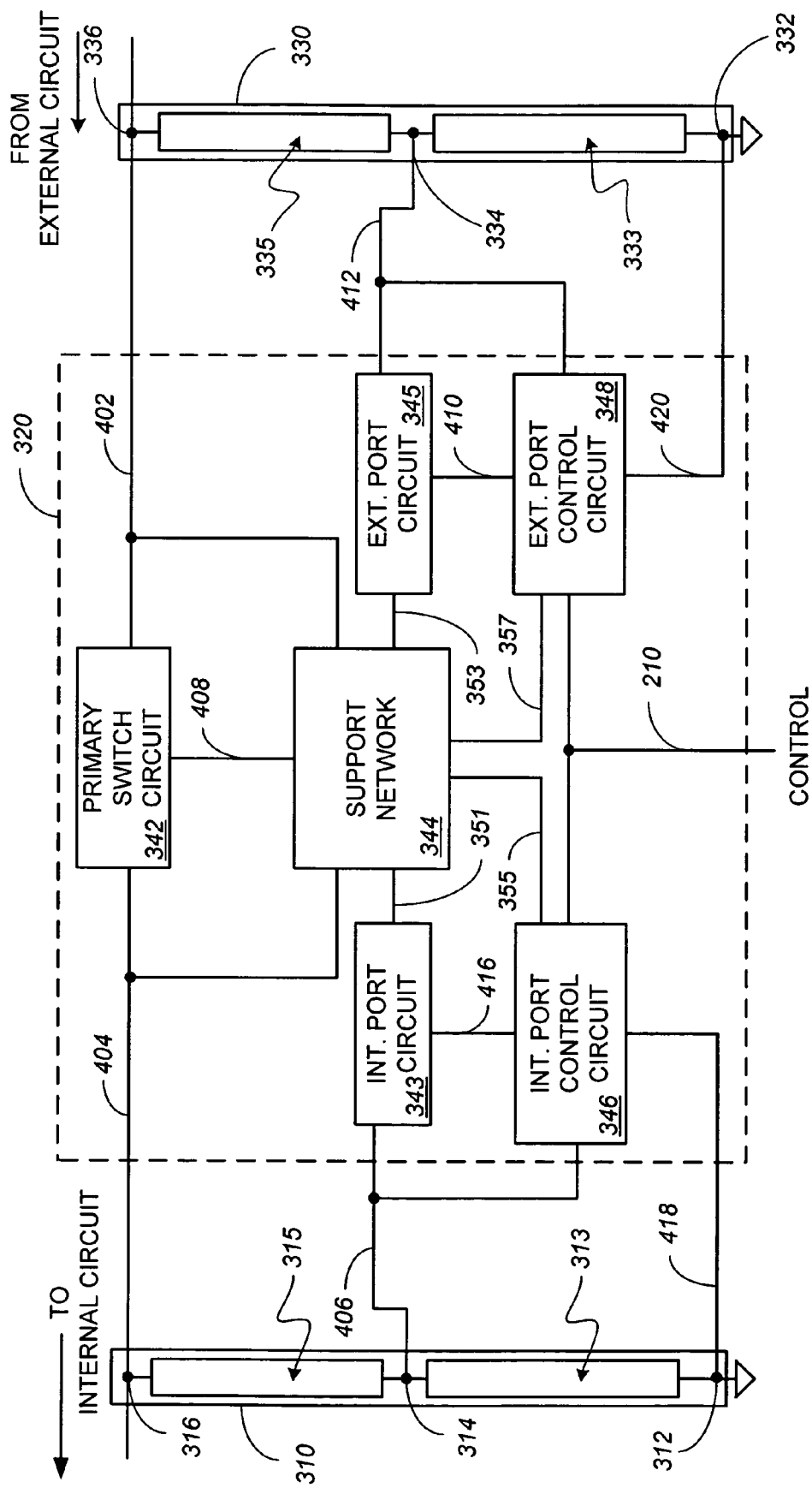
FIG. 3B is a functional block diagram illustrating an embodiment of the switch assembly of FIG. 3A.

FIG. 3B is a functional block diagram illustrating an embodiment of the switch assembly 124 of FIG. 3A. Specifically, the diagram illustrates the various elements and interconnections of the network of semiconductor circuits 320. Primary switch circuit 342 is coupled to the high-voltage port 316 of first multiple-port interface 310 via connection 404 and high-voltage port 336 of second multiple-port interface 330 via connection 402. Primary switch circuit 342 is further coupled to support network 344 via connection 408. Internal-port circuit 343 is connected to the intermediate-voltage port 314 of first multiple-port interface 310 via connection 406. Internal-port circuit 343 is also coupled to support network 344 via connection 351 and internal-port control circuit 346 via connection 416. External-port circuit 345 is connected to the intermediate-voltage port 334 of the second multiple-port interface 330 via connection 412. External-port circuit 345 is also coupled to support network 344 via connection 353 and external-port control circuit 348 via connection 410. In addition to the above-described connectivity, support network 344 is coupled to high-voltage port 316 via connection 404 and high-voltage port 336 via connection 402, as well as being connected to internal-port control circuit 346 via conductor 355 and external-port control circuit 348 via conductor 357. Internal-port control circuit 346 is further coupled to ground port 312 via connection 418 and receives a control signal via control input 210. In the illustrated embodiment, internal-port control circuit 346 is further coupled to the intermediate-voltage port 314 of the first multiple-port interface 310 via connection 406. Alternative embodiments of switch assembly 124 may not include this connectivity. External-port control circuit 348 is further coupled to ground port 332 via connection 420, intermediate-voltage port 334 via connection 412 and receives the switch assembly control signal via control input 210.

Figure 4:
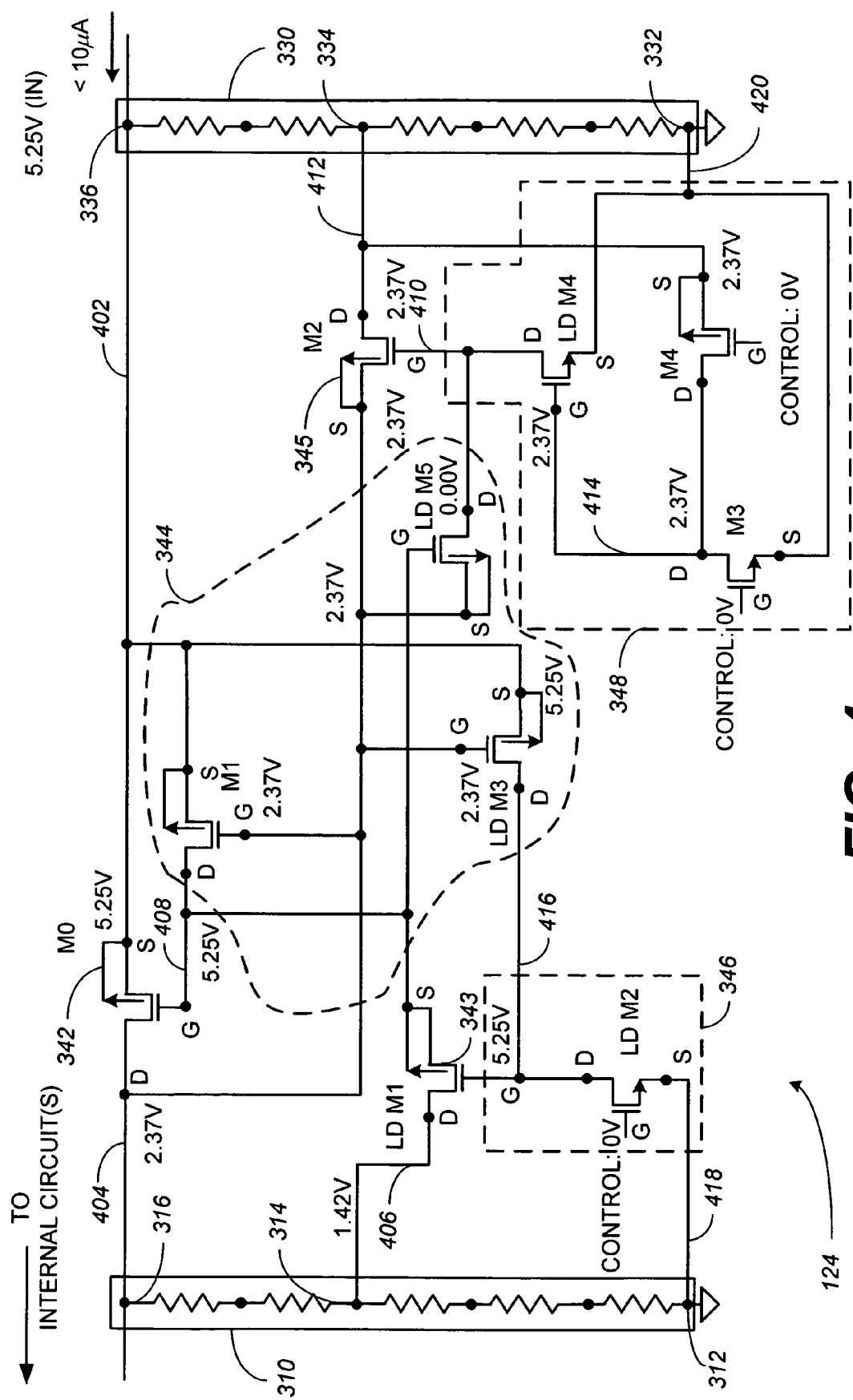
FIG. 4 is a schematic diagram illustrating operation of the switch assembly of FIG. 3A and FIG. 3B when the switch assembly is directed to an open state and coupled to an external power supply providing 5.25V in accordance with the USB-OTG extension.

FIG. 4 is a schematic diagram illustrating an embodiment of the architecture and steady-state operation of the switch assembly 124 of FIG. 3B when a USB-OTG "B" device is coupled to the switch assembly 124 via first multiple-port interface 310, an USB-OTG "A" device is coupled to the switch assembly 124 via second multiple-port interface 330, the "A" device provides 5.25V, and the switch assembly 124 is directed to the "open" state.

In the illustrated embodiment, support network 344, internal-port control circuit 346 and external-port control circuit 348 are bounded by "dashed" lines. Primary switch circuit 342 is implemented with a single positive-channel metal oxide semiconductor (PMOS) field-effect transistor (FET) labeled "M0." The drain of M0 is coupled to support network 344 and the high-voltage port 316 of first multiple-port interface 310. The gate of M0 is coupled to support network 344 via connection 408. The source of M0 is coupled to high-voltage port 336 of second multiple-port interface 330 via connection 402.

Internal-port circuit 343 is implemented with a single laterally diffused PMOS FET labeled "LD M1." The drain of LD M1 is coupled to the intermediate-voltage port 314 of first multiple-port interface 310 via connection 406. The gate of LD M1 is coupled to support network 344 and internal-port control circuit 346 via connection 416. The source of LD M1 is coupled to support network 344.

External-port circuit 345 is implemented with a single PMOS FET labeled "M2." The drain of M2 is coupled to the intermediate-voltage port 334 of second multiple-port interface 330 via connection 412. The gate of M2 is coupled to external-port control circuit 348 via connection 410. The source of M2 is coupled to support network.

Internal-port control circuit 346 is implemented with a single laterally diffused negative-channel metal oxide semiconductor (NMOS) labeled "LD M2." The drain of LD M2 is coupled to the gate of LD M1. The gate of LD M2 is coupled to a control input (e.g., control input 210 of FIG. 3B). The source of LD M2 is coupled to the ground port 312 of the first multiple-port interface 310 via connection 418.

Support network 344 is implemented using three semiconductor transistors. A first PMOS FET, labeled "M1;" and second and third laterally diffused PMOS FETs labeled "LD M3" and "LD M5," respectively. M1 is arranged such that the drain of M1 is coupled to the gate of primary switch circuit 342, the gate of LD M5, and the source of LD M1. The source of M1 is coupled to the source of LD M3 and connection 402 and the gate of M1 is coupled to the gate of LD M3 and the source terminals of M2 and LD M5 via connection 404. Connection 416 is coupled to the drain of LD M3 and connection 410 is coupled to the drain of LD M5.

External-port control circuit 348 is implemented using three semiconductor transistors. A first laterally diffused NMOS FET, labeled "LD M4," a second PMOS FET labeled "M4," and a third NMOS FET, labeled "M3." LD M4 is arranged such that the drain of LD M4 is coupled to the drain of LD M5 and the gate of M2, the source of LD M4 is coupled to the source of M3 and the ground port 332 of second multiple-port interface 330 via connection 420, and the gate of LD M4 is coupled to drains of M4 and M3 via connection 414. M4 is arranged such that the source of M4 is coupled to the intermediate-voltage port 334 of second multiple-port interface 330 via connection 412. The gates of M4 and M3 are coupled to the control input.

In the illustrated mode of operation (i.e., with switch assembly 124 "open"), devices M0, LD M1, LD M2, LD M5, and M3 are "off," while devices M1, M2, M4, LD M3, and LD M4 are "on." As is known, a transistor that is "on" functions as a closed switch or a short circuit, whereas a transistor that is "off" functions as an open switch or an open circuit. When device M0 is "off," the high-voltage port 316 of first multiple-port interface 310 will be isolated from high-voltage port 336 of second multiple-port interface 330. Conversely, when device M0 is "on," the high-voltage port 316 of first multiple-port interface 310 will be connected to the high-voltage port 336 of second multiple-port interface 330. Switch assembly 124 is configured such that the voltage levels between any two terminals in the transistor devices of switch assembly 124 are within safe operating limits for long term operation over a desired range of power bus voltage levels (i.e., voltage levels on high-voltage port 316 and high-voltage port 336).

For example, for LD NMOS devices only Vdg, Vds and Vdb, the voltage difference between the drain terminal and gate terminal, the voltage difference between the drain terminal and the source terminal, and the voltage difference between the drain terminal and the bulk of the respective device, can exceed 3.6V. These voltages can go as high as about 12V to 18V depending on materials and manufacturing techniques used to produce the devices. For LD PMOS devices only Vdg, Vds and Vdb can exceed −3.6V. Devices M0 through M4 are standard metal-oxide semiconductor transistors. Typically, standard metal-oxide semiconductor transistors reliably operate at voltages up to approximately 3.6V between any two terminals. Of these, devices M0, M1, M2, and M4 are PFETs and device M3 is an NFET. Devices LD M1 through LD M5 are laterally diffused metal-oxide semiconductor transistors. Of these, LD M2 and LD M4 are NMOS devices and LD M1, LD M3 and LD M5 are PMOS devices.

As shown in the illustrated embodiment, when 5.25V is applied at the high-voltage port 336 of second multiple-port interface 330 and the control input is 0V, ground port 312 and ground port 332 are at electrical ground, connection 410 is at 0V, connection 406 is at 1.42V, connection 404, connection 412, and connection 414 are at 2.37V, whereas connection 402, connection 408, and connection 416 are at 5.25V. Under the above-referenced conditions, less than 10 μAmps of current is dissipated in switch assembly 124.

M0 has a maximum terminal voltage difference of about 5.25V−2.37V=2.88V between the gate and the drain terminals and the source and the drain terminals. M1 has a maximum terminal voltage difference of about 5.25V−2.37V=2.88V between both the drain and the gate and the source and the gate terminals of the device, respectively. M2 has a maximum terminal voltage difference of about 2.37V−0.00V=2.37V between both the drain and the gate and the source and the gate terminals of the device. M3 has a maximum terminal voltage difference of about 2.37V−0.00V=2.37V between both the drain and the gate and the drain and the source terminals of the device. M4 has a maximum terminal voltage difference of about 2.37V−0.00V=2.37V between both the drain and the gate and the source and the gate terminals of the device. LD M1 has a maximum terminal voltage difference of about 5.25V−1.42V=3.83V between both the gate and the drain and the source and the drain terminals of the device, respectively. LD M2 has a maximum terminal voltage difference of about 5.25V−0.00V=5.25V between both the drain and the gate and the drain and the source terminals of the device. LD M3 has a maximum terminal voltage difference of about 5.25V−2.37V=2.88V between both the source and the gate and the drain and the gate terminals of the device. LD M4 has a maximum terminal voltage difference of about 2.37V−0.00V=2.37V between both the drain and the gate and the source and the gate terminals of the device. LD M5 has a maximum terminal voltage difference of about 5.25V−2.37V=2.88V between the gate and the source terminals of the device and about 5.25V−0.00V=5.25V between the gate and the drain terminals of the device.

The voltage differences across terminals within three semiconductor devices exceed 3.6V. LD M1, which is a laterally diffused PMOS device, has a drain to gate voltage difference and a drain to source voltage difference of about −3.83V, which is permitted for safe long term operation of the switch assembly 124. LD M2, which is a laterally diffused NMOS device, has a drain to gate voltage difference and a drain to source voltage difference of about 5.00V, which is permitted. LD M5, which is a laterally diffused PMOS device, has a drain to gate voltage difference of −5.25V, which is permitted. The voltages differences between all other terminals of the semiconductor devices of the switch assembly 124 are less than 3.6V. Accordingly, the voltage between respective terminals of each of the semiconductor devices is within safe limits for long term reliable operation of the respective devices used to construct switch assembly 124.

Figure 5:
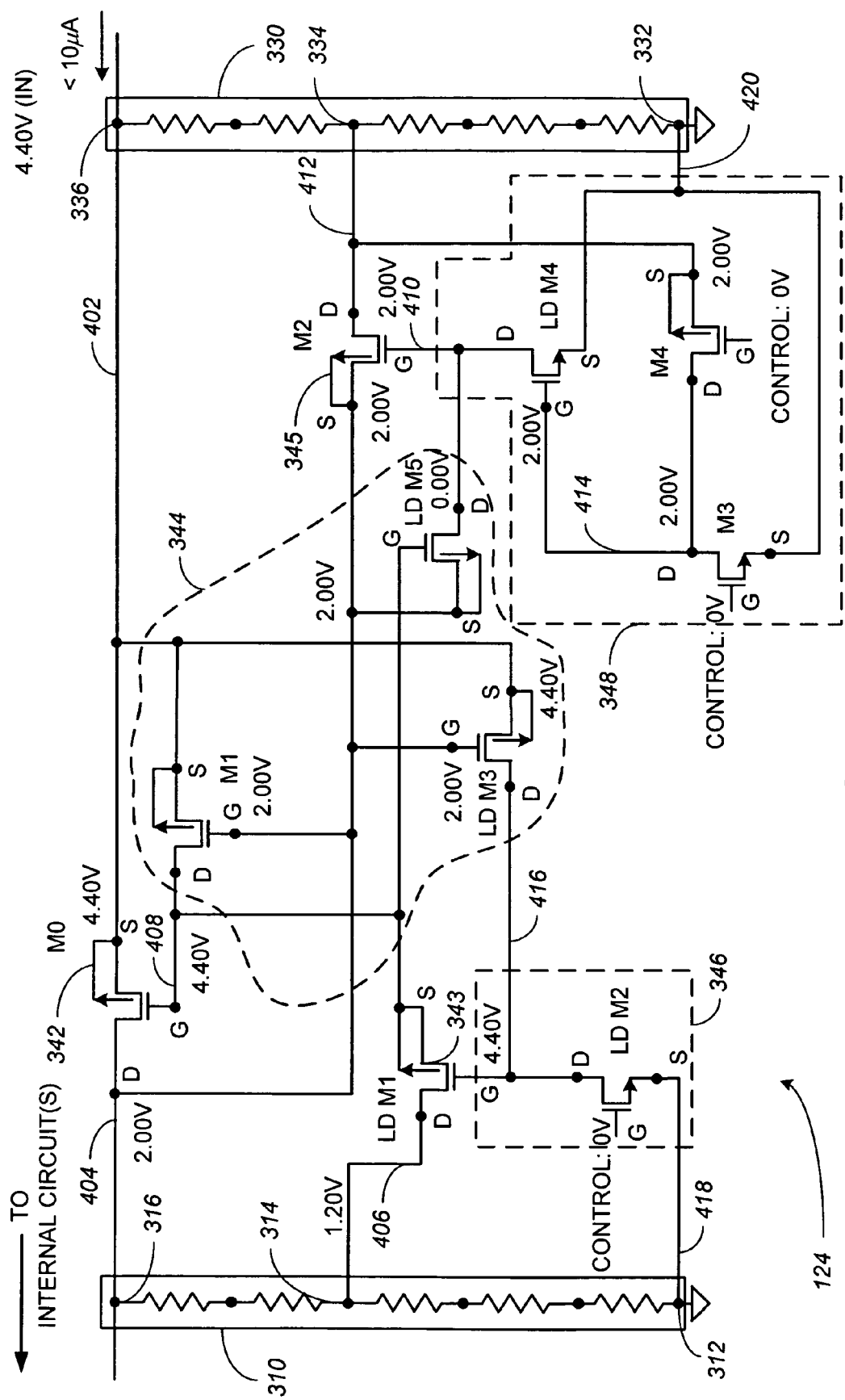
FIG. 5 is a schematic diagram illustrating operation of the switch assembly of FIG. 3A and FIG. 3B when the switch assembly is directed to an open state and coupled to an external power supply providing 4.40V in accordance with the USB-OTG extension.

FIG. 5 is a schematic diagram illustrating an embodiment of the architecture and steady-state operation of the switch assembly 124 of FIG. 3B when the switch assembly 124 is coupled to a USB-OTG "B" device, the "A" device is providing 4.40V and the switch assembly is directed to the open state. The control input and the architecture of switch assembly 124 remain the same as described above regarding FIG. 4.

As shown in the illustrated embodiment of FIG. 5, when 4.40V is applied at the high-voltage port 336 of second multiple-port interface 330 and the control input is 0.00V, ground port 312 and ground port 332 are at electrical ground, connection 410 is 0.00V, connection 406 is at 1.20V, connection 404, connection 412, and connection 414 are at 2.00V, whereas connection 402, connection 408, and connection 416 are at 4.40V. Under the above-referenced conditions, less than 10 μAmps of current is dissipated in switch assembly 124.

M0 has a maximum terminal voltage difference of about 4.40V−2.00V=2.40V between the gate and the drain terminals and the source and the drain terminals. M1 has a maximum terminal voltage difference of about 4.40V−2.00V=2.40V between both the drain and the gate and the source and the gate terminals of the device, respectively. M2 has a maximum terminal voltage difference of about 2.00V−0.00V=2.00V between both the drain and the gate and the source and the gate terminals of the device. M3 has a maximum terminal voltage difference of about 2.00V−0.00V=2.00V between both the drain and the gate and the drain and the source terminals of the device. M4 has a maximum terminal voltage difference of about 2.00V−0.00V=2.00V between both the drain and the gate and the source and the gate terminals of the device. LD M1 has a maximum terminal voltage difference of about 4.40V−1.20V=3.20V between both the gate and the drain and the source and the drain terminals of the device, respectively. LD M2 has a maximum terminal voltage difference of about 4.40V−0.00V=4.40V between both the drain and the gate and the drain and the source terminals of the device. LD M3 has a maximum terminal voltage difference of about 4.40V−2.00V=2.40V between both the source and the gate and the drain and the gate terminals of the device. LD M4 has a maximum terminal voltage difference of about 2.00V−0.00V=2.00V between both the drain and the gate and the source and the gate terminals of the device. LD M5 has a maximum terminal voltage difference of about 4.40V−2.00V=2.40V between the gate and the source terminals of the device and about 4.40V−0.00V=4.40V between the gate and the drain terminals of the device.

In the illustrated example, the voltage differences across terminals within two semiconductor devices exceed 3.6V. LD M2, which is a laterally diffused NMOS device, has a drain to gate voltage difference and a drain to source voltage difference of about 4.40V, which is permitted. LD M5, which is a laterally diffused PMOS device, has a drain to gate voltage difference of −4.40V, which is permitted. The voltage across all other terminals of the semiconductor devices of the switch assembly 124 are less than 3.6V. Accordingly, the voltage between respective terminals of each of the semiconductor devices is within safe limits for long term reliable operation of the respective devices used to construct the example switch assembly 124.

Figure 6:
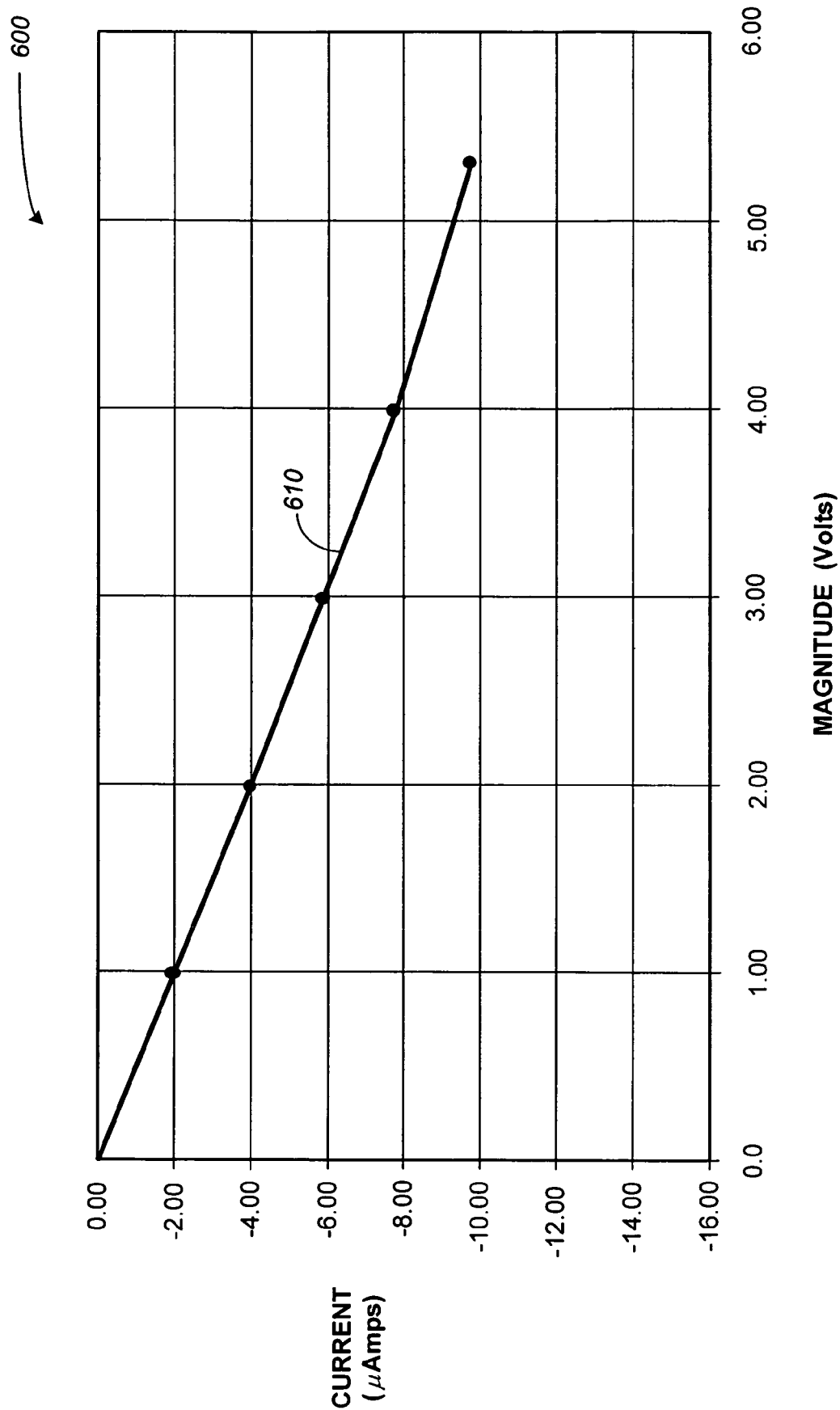
FIG. 6 is a plot illustrating current loss in the switch assembly of FIG. 3A and FIG. 3B when the switch assembly is directed to the open state.

FIG. 6 is a plot 600 illustrating current loss in the switch of FIG. 3 when the switch is directed to the open state and the supply voltage at the high-voltage port 336 of second multiple-port interface 330 is ramped from 0.00V to about 5.25V. The vertical axis depicts current loss in negative μAmps. The horizontal axis depicts the magnitude of the applied power bus voltage in volts. As illustrated in the plot of FIG. 6, current loss 610 is relatively linear and varies from 0.00 μAmps when the power bus voltage is 0.00V to approximately −9.60 μAmps when the power bus voltage is approximately 5.25V. Thus, the off or "open" state input impedance of switch assembly 124 is greater than 500 kOhms, which satisfies the USB-OTG SRP requirement of input impedance of greater than 40 kOhms at power bus voltage levels from 0.00V to 5.25V.

Figure 7:
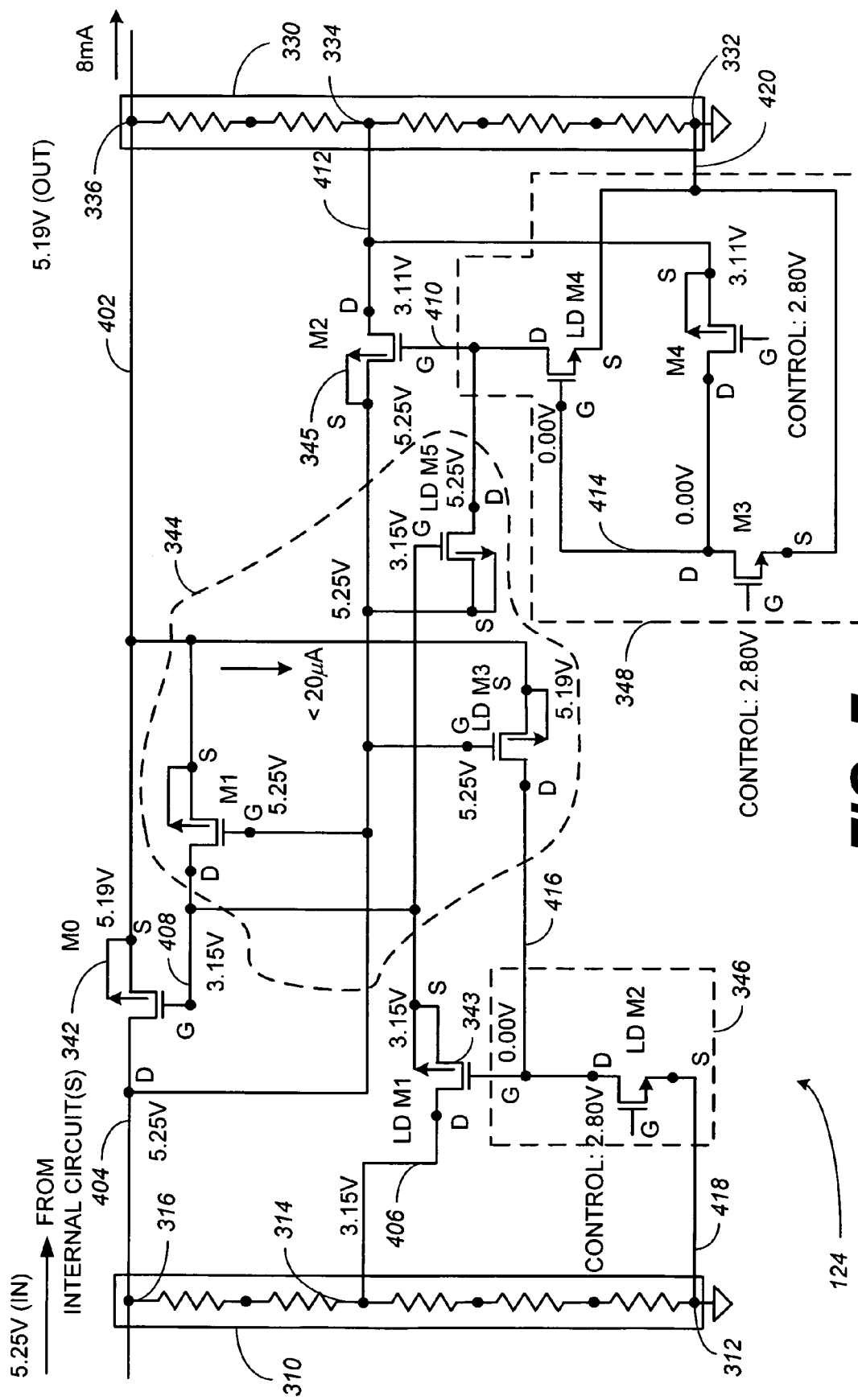
FIG. 7 is a schematic diagram illustrating operation of the switch assembly of FIG. 3A and FIG. 3B when the switch assembly is directed to a closed state and coupled to an internal power supply providing 5.25V in accordance with the USB-OTG extension.

FIG. 7 is a schematic diagram illustrating an embodiment of the architecture and steady-state operation of the switch assembly 124 of FIG. 3B when the switch assembly 124 is coupled to an "A" device via first multiple-port interface 310, the "A" device is providing 5.25V and the switch is directed to the closed state. The architecture of switch assembly 124 is arranged the same as described above regarding FIG. 4. In this embodiment, the control input is adjusted to a logic high level of approximately 2.8V.

As shown in the illustrated embodiment of FIG. 7, when 5.25V is applied at the high-voltage port 316 of first multiple-port interface 310 and the control input is 2.80V, ground port 312 and ground port 332 are at electrical ground, connection 414 and connection 416 are at 0.00V, connection 412 is at 3.11V, connection 406 and connection 408 are at 3.15V, connection 402 is at 5.19V, whereas connection 404 and connection 410 are at 5.25V. Under the above-referenced conditions, less than 20 μAmps of current is dissipated in switch assembly 124 and approximately 8 mAmps of current is provided from the internal circuits to a device coupled to second multiple-port interface 330 (not shown).

M0 has a maximum terminal voltage difference of about 5.25V−5.19V=0.06V between the drain and the source terminals and a maximum difference of 5.25V−3.15V=2.10V between the drain and the gate terminals. M1 has a maximum terminal voltage difference of about 5.25V−5.19V=0.06V between the gate and the source terminals and a maximum difference of 5.25V−3.15V=2.10V between the gate and the drain terminals. M2 has a maximum terminal voltage difference of about 5.25V−3.11V=2.14V between both the source and the drain and the gate and the drain terminals of the device. M3 has a maximum terminal voltage difference of about 2.80V−0.00V=2.80V between both the gate and the drain terminals and the gate and the source terminals of the device. M4 has a maximum terminal voltage difference of about 3.11V−2.80V=0.31V between the source and the gate terminals and a maximum voltage difference of about 3.11V−0.00V=3.11V between source and the drain terminals of the device. LD M1 has a maximum terminal voltage difference of about 3.15V−0.00V=3.15V between both the drain and the gate and the source and the gate terminals of the device, respectively. LD M2 has a maximum terminal voltage difference of about 2.80V−0.00V=2.80V between both the gate and the drain and the gate and the source terminals of the device, respectively. LD M3 has a maximum terminal voltage difference of about 5.25V−0.00V=5.25V between the gate and the drain terminals of the device, a maximum terminal voltage difference of about 5.25V−5.19V=0.06V between the gate and the source terminal and a maximum terminal difference of 5.19V−0.00V=5.19V between the source and the drain terminals of the device. LD M4 has a maximum terminal voltage difference of about 5.25V−0.00V=5.25V between both the drain and the gate and the drain and the source terminals of the device. LD M5 has a maximum terminal voltage difference of about 5.25V−3.15V=2.10V between the drain and the gate and the source and the gate terminals of the device.

In the illustrated example, the voltage differences across terminals within two semiconductor devices exceed 3.6V. LD M3, which is a laterally diffused PMOS device, has a drain to gate voltage difference of about −5.25V and a drain to source voltage difference of about −5.19V, both of which are permitted. LD M4, which is a laterally diffused NMOS device, has a drain to gate and a drain to source terminal voltage difference of 5.25V, which are permitted. The voltages across all other terminals of the semiconductor devices of the switch assembly 124 are less than 3.6V. Accordingly, the voltage between respective terminals of each of the semiconductor devices is within safe limits for long term reliable operation of the respective devices used to construct the example switch assembly 124.

Figure 8:
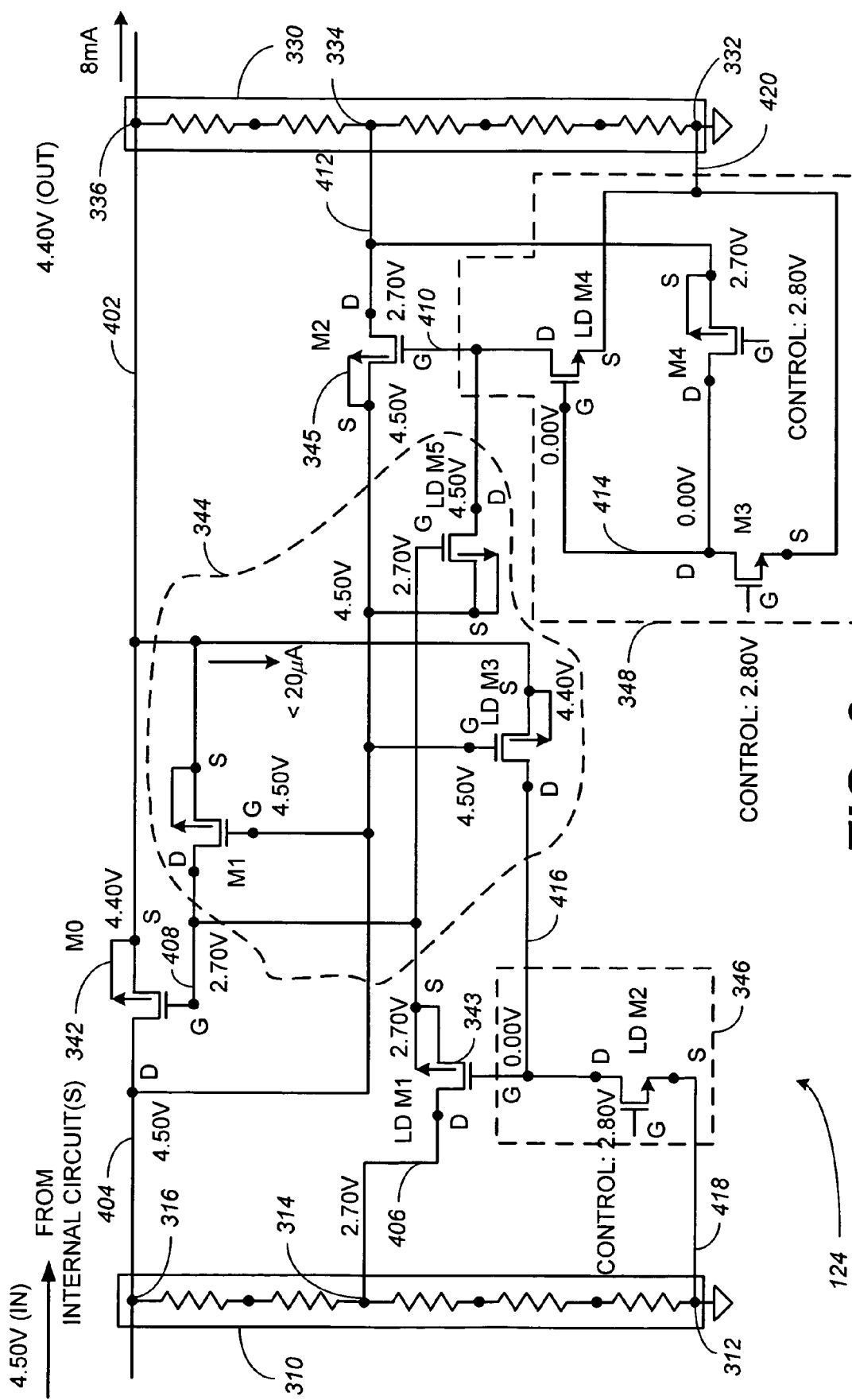
FIG. 8 is a schematic diagram illustrating operation of the switch assembly of FIG. 3A and FIG. 3B when the switch assembly is directed to a closed state and coupled to an internal power supply providing 4.40V in accordance with the USB-OTG extension.

FIG. 8 is a schematic diagram illustrating an embodiment of the architecture and steady-state operation of the switch assembly 124 of FIG. 3B when the switch assembly 124 is coupled to an "A" device via first multiple-port interface 310, the "A device is providing 4.50V and the switch is directed to the closed state. The architecture of switch assembly 124 is arranged the same as described above regarding FIG. 4. The control input is adjusted to 2.80V.

As shown in the illustrated embodiment of FIG. 8, when 4.50V is applied at the high-voltage port 316 of first multiple-port interface 310 and the control input is 2.80V, ground port 312 and ground port 332 are at electrical ground, connection 414 and connection 416 are at 0.00V, connection 406, connection 408 and connection 412 are at 2.70V, connection 402 is at 4.40V, whereas connection 404 and connection 410 are at 4.50V. Under the above-referenced conditions, less than 20 µAmps of current is dissipated in switch assembly 124 and approximately 8 mAmps of current is provided from the internal circuits to a device coupled to second multiple-port interface 330 (not shown).

M0 has a maximum terminal voltage difference of about 4.50V−4.40V=0.10V between the drain and the source terminals and a maximum difference of 4.50V−2.70V=1.80V between the drain and the gate terminals. M1 has a maximum terminal voltage difference of about 4.50V−4.40V=0.10V between the gate and the source terminals and a maximum difference of 4.50V−2.70V=1.80V between the gate and the drain terminals. M2 has a maximum terminal voltage difference of about 4.50V−2.70V=1.80V between both the source and the drain and the gate and the drain terminals of the device. M3 has a maximum terminal voltage difference of about 2.80V−0.00V=2.80V between both the gate and the drain terminals and the gate and the source terminals of the device. M4 has a maximum terminal voltage difference of about 2.80V−2.70=0.10V between the gate and the source terminals and a maximum voltage difference of about 2.70−0.00V=2.70V between the source and the drain terminals and a maximum voltage difference of about 2.80V−0.00V=2.80V between the gate and the drain terminals of the device. LD M1 has a maximum terminal voltage difference of about 2.70V−0.00V=2.70V between both the drain and the gate and the source and the gate terminals of the device, respectively. LD M2 has a maximum terminal voltage difference of about 2.80V−0.00V=2.80V between both the gate and the drain and the gate and the source terminals of the device, respectively. LD M3 has a maximum terminal voltage difference of about 4.50V−0.00V=4.50V between the gate and the drain terminals of the device, a maximum terminal voltage difference of about 4.50V−4.40V=0.10V between the gate and the source terminal and a maximum terminal difference of 4.40−0.00V=4.40V between the source and the drain terminals of the device. LD M4 has a maximum terminal voltage difference of about 4.50V−0.00V=4.50V between both the drain and the gate and the drain and the source terminals of the device. LD M5 has a maximum terminal voltage difference of about 4.50V−2.70V=1.80V between the drain and the gate and the source and the gate terminals of the device.

In the illustrated example, the voltage differences across terminals within two semiconductor devices exceed 3.6V. LD M3, which is a laterally diffused PMOS device, has a drain to gate voltage difference of about −4.50V and a drain to source voltage difference of about −4.40V, both of which are permitted. LD M4, which is a laterally diffused NMOS device, has a drain to gate and a drain to source terminal voltage difference of 4.50V, which are permitted. The voltages across all other terminals of the semiconductor devices of the switch assembly 124 are less than 3.6V. Accordingly, the voltage between respective terminals of each of the semiconductor devices is within safe limits for long term reliable operation of the respective devices used to construct the example switch assembly 124.

Figure 9:
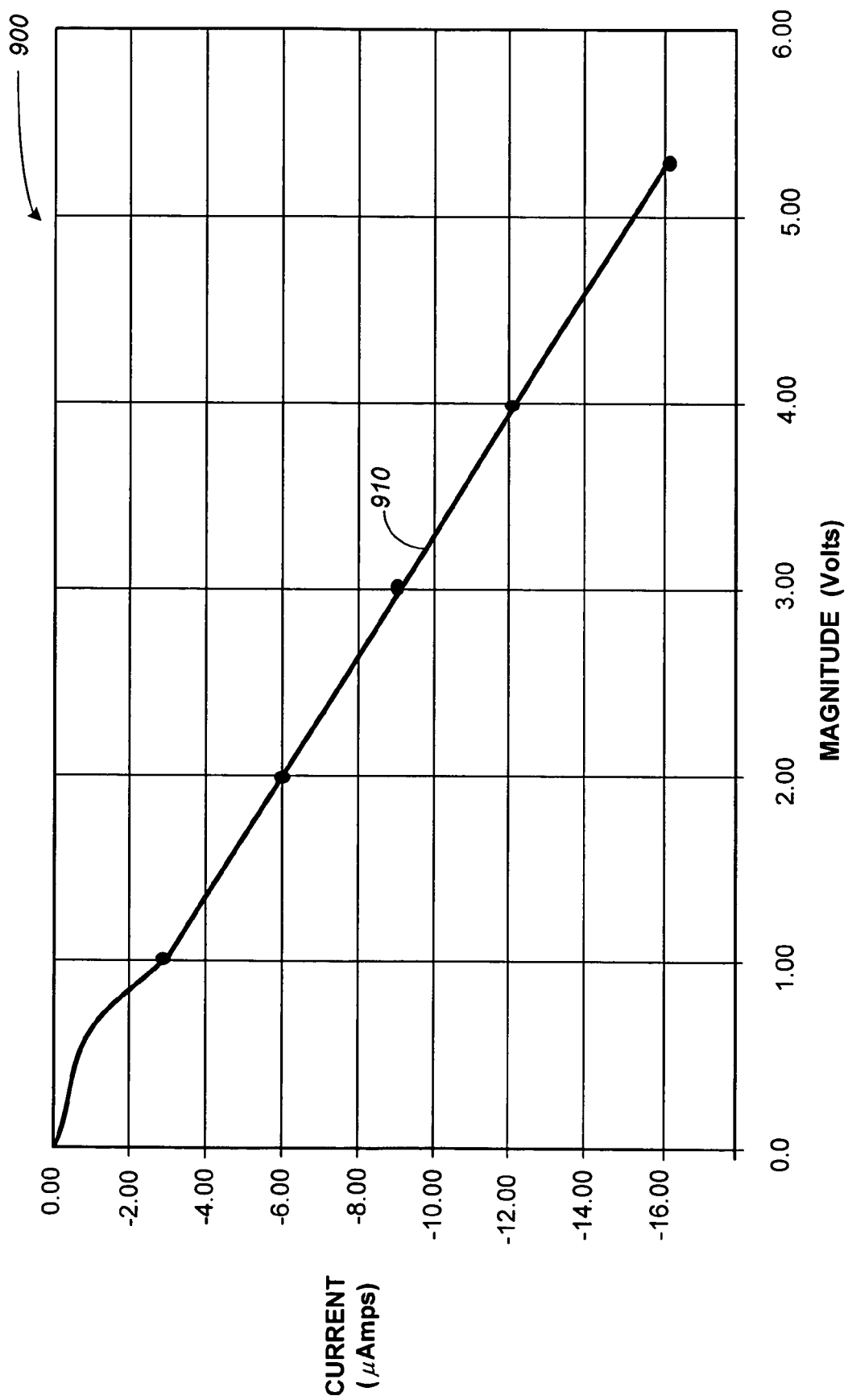
FIG. 9 is a plot illustrating current loss in the switch assembly of FIG. 3A and FIG. 3B when the switch assembly is directed to the closed state.

FIG. 9 is a plot illustrating current loss in the switch of FIG. 3 when the switch is directed to the closed state. The vertical axis depicts current loss in negative µAmps. The horizontal axis depicts the magnitude of the applied power bus voltage in volts. As illustrated in the plot of FIG. 9, current loss 910 is relatively linear from about 1.00V to 5.25V and varies from 0.00 µAmps when the power bus voltage (i.e., the voltage present on the high-voltage port 316 is 0.00V to approximately −16.60 µAmps when the bus voltage is approximately 5.25V. Thus, the on or "closed" state exhibits relatively insignificant current loss and satisfies the USB-OTG SRP requirement for power bus operation between an "A" device and a "B" device at voltage bus levels from about 4.40V to 5.25V.

Figure 10:
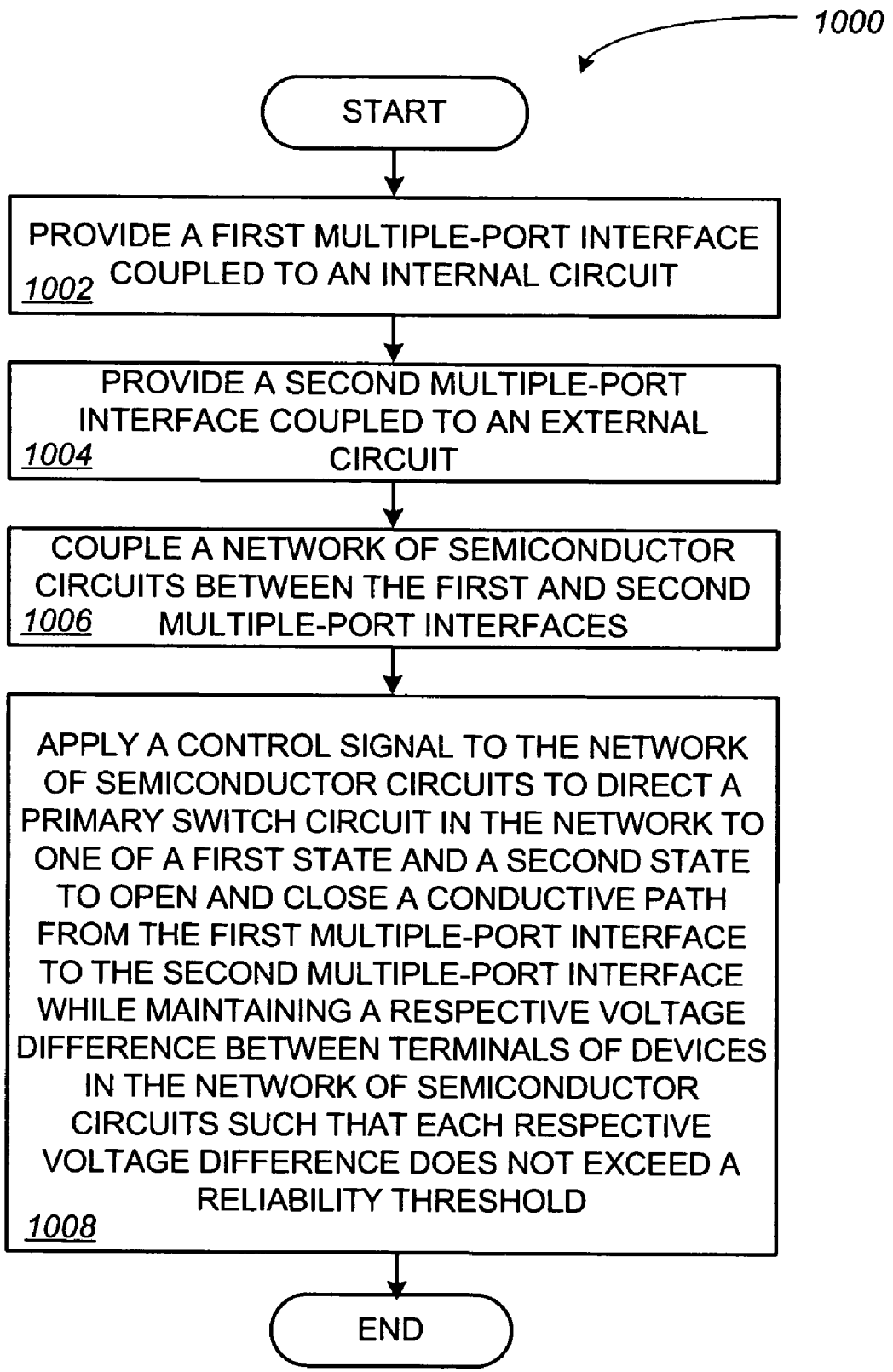
FIG. 10 is a flow chart illustrating an embodiment of a method for managing power between circuits.

FIG. 10 is a flow chart illustrating an embodiment of a method for managing power between circuits. Method 1000 begins with block 1002 where a first multiple-port interface is coupled to an internal circuit. In block 1004 a second multiple-port interface is coupled to an external circuit. Thereafter, as indicated in block 1006, a network of semiconductor circuits is coupled between the first and second multiple-port interfaces. Once the components have been arranged as described in blocks 1002 through 1006, a control signal is applied to the network of semiconductor circuits to direct a primary switch circuit in the network to one of a first state or a second state to open and close a conductive path from the first multiple-port interface to the second multiple-port interface while maintaining a respective voltage difference between terminals of devices in the network of semiconductor circuits such that each respective voltage difference does not exceed a reliability threshold, as shown in block 1008.

While various embodiments of the switch assembly and methods for power management have been described, it will be apparent to those of ordinary skill in the art that many more embodiments and implementations are possible that are within the scope of this disclosure. Furthermore, it should be understood that the switch assembly can be controllably switched to a closed state to couple an external power supply to additional circuits and controllably switched to an open state in the presence of an internal power supply to isolate external circuits. In both of these additional configurations, which were not illustrated in the figures and described above, it can be shown that the switch assembly maintains a respective voltage difference between terminals of devices in the network of semiconductor circuits such that each respective voltage difference does not exceed a reliability threshold. Accordingly, the switch assembly and methods for power management are not to be restricted except in light of the attached claims and their equivalents.

What is claimed is:

1. A method for managing power between circuits, the method comprising:
   providing a first multiple-port interface coupled to an internal circuit;
   providing a second multiple-port interface coupled to an external circuit;
   coupling a network of semiconductor circuits between the first multiple-port interface and the second multiple-port interface; and
   applying a control signal to the network of semiconductor circuits to direct a primary switch circuit located within the network to one of a first state and a second state to open and close a conductive path from the first multiple-port interface to the second multiple-port interface while maintaining a respective voltage difference between terminals of devices in the network of semiconductor circuits such that each respective voltage difference does not exceed a reliability threshold.

2. The method of claim 1, wherein applying a control signal comprises coupling the control signal to first and second control circuits.

3. The method of claim 2, wherein the first control circuit is coupled to an internal-port circuit, a support network and the first multiple-port interface.

4. The method of claim 3, wherein at least one of the first control circuit and the support network comprise a laterally diffused metal-oxide semiconductor transistor.

5. The method of claim 2, wherein the second control circuit is coupled to an external-port circuit, a support network and the second multiple-port interface.

6. The method of claim 5, wherein at least one of the second control circuit and the support network comprise a laterally diffused metal-oxide semiconductor transistor.

7. The method of claim 1, wherein providing respective first and second multiple-port interfaces comprises arranging devices to provide a high voltage, an intermediate voltage and a ground.

8. The method of claim 1, wherein coupling a network of semiconductor circuits comprises constructing an integrated circuit using the same manufacturing process as one of the internal circuit and the external circuit.

9. The method of claim 8, wherein the manufacturing process is a single well process.

10. The method of claim 8, wherein the network of semiconductor circuits and one of the internal circuit and the external circuit are implemented on a single integrated circuit substrate.

11. The method of claim 1, wherein coupling a network of semiconductor circuits comprises arranging the primary switch circuit, a support network and respective internal and external-port circuits.

12. The method of claim 1, wherein coupling a network of semiconductor circuits comprises arranging the semiconductor circuits to prevent leakage current of greater than 20 μ amperes from traversing the network of semiconductor circuits.

13. The method of claim 1, wherein coupling a network of semiconductor circuits comprises constructing the primary switch circuit using a single positive-channel metal oxide semiconductor (PMOS) device.

14. A switch circuit assembly, comprising:
   a first and a second multiple-port interface each having respective high-voltage, intermediate-voltage and ground ports;
   a primary switch circuit coupled to the respective high-voltage ports of the first and second multiple-port interfaces and a support network;
   an internal-port circuit coupled to the intermediate-voltage port of the first multiple-port interface, an internal-port control circuit and the support network; and
   an external-port circuit coupled to the intermediate-voltage port of the second multiple-port interface, an external-port control circuit and the support network, wherein the internal-port control circuit is coupled to the internal-port circuit, the support network and the ground port of the first multiple-port interface and the external-port control circuit is coupled to the external-port circuit, the support network, and the intermediate-voltage and ground ports of the second multiple-port interface.

15. The switch circuit assembly of claim 14, wherein the primary switch circuit is responsive to the support network.

16. The switch circuit assembly of claim 15, wherein the support network is responsive to both the internal-port circuit and the external-port circuit.

17. The switch circuit assembly of claim 14, wherein the internal and external-port circuits are responsive to a control input.

18. The switch circuit assembly of claim 14, wherein the primary switch circuit, the support network, the internal-port circuit and the external-port circuit are configured to substantially replicate an open circuit between the respective high-voltage ports of the first and second multiple-port interfaces in response to the control input.

19. The switch circuit assembly of claim 14, wherein the primary switch circuit, the support network, the internal-port circuit and the external-port circuit are configured to replicate a short circuit between the respective high-voltage ports of the first and second multiple-port interfaces in response to the control input.

20. The switch circuit assembly of claim 14, wherein the internal-port circuit, the external-port circuit and the support network are configured to prevent leakage current of greater than 20 μ amperes from traversing the assembly when the assembly is directed to replicate a closed circuit via the control input.

21. The switch circuit assembly of claim 14, wherein the internal-port circuit, the external-port circuit and the support network are configured to prevent leakage current of greater than 10 μ amperes from traversing the assembly when the assembly is directed to replicate an open circuit via the control input.

22. The switch circuit assembly of claim 14, wherein the support network is further coupled to the high-voltage ports of the first and second multiple-port interfaces.

23. The switch circuit assembly of claim 14, wherein the primary switch circuit comprises a positive-channel metal oxide semiconductor (PMOS) field-effect transistor.

24. A switch circuit assembly, comprising:
a first and a second multiple-port interface each having respective high-voltage, intermediate-voltage and ground ports; and
a network of semiconductor circuits responsive to a control input coupled between the high-voltage, intermediate-voltage and ground ports of the first and second multiple-port interfaces and configured such that over a select range of high-voltage levels applied to the respective high-voltage ports of the first and second multiple-port interfaces a respective voltage difference between terminals of devices in the network of semiconductor circuits does not exceed a reliability threshold associated with the integrated circuit manufacturing process used to implement the network of semiconductor circuits.

\* \* \* \* \*